United States Patent
Barbieri et al.

(10) Patent No.: US 8,035,450 B2
(45) Date of Patent: Oct. 11, 2011

(54) OPERATIONAL TRANSCONDUCTANCE AMPLIFIER HAVING TWO AMPLIFICATION STAGES

(75) Inventors: Andrea Barbieri, Casalpusterlengo (IT); Sergio Pernici, Bergamo (IT); Germano Nicollini, Piacenza (IT)

(73) Assignee: ST-Ericsson SA, Plan-les-Ouates (CH)

( * ) Notice: Subject to any disclaimer, the term of this patent is extended or adjusted under 35 U.S.C. 154(b) by 26 days.

(21) Appl. No.: 12/630,691

(22) Filed: Dec. 3, 2009

(65) Prior Publication Data

US 2010/0141343 A1    Jun. 10, 2010

(30) Foreign Application Priority Data

Dec. 5, 2008    (IT) ............... MI08A002160

(51) Int. Cl.
*H03F 1/14* (2006.01)
(52) U.S. Cl. .......................................... 330/292
(58) Field of Classification Search .............. 330/107, 330/292
See application file for complete search history.

(56) References Cited

U.S. PATENT DOCUMENTS

| | | | |
|---|---|---|---|
| 4,835,489 A | 5/1989 | Monticelli | |
| 5,917,376 A | 6/1999 | Ivanov et al. | |
| 5,990,748 A | 11/1999 | Tomasini et al. | |
| 6,222,418 B1 | 4/2001 | Gopinathan et al. | |
| 6,556,077 B2 | 4/2003 | Schaffer et al. | |
| 7,199,656 B1 | 4/2007 | Aram et al. | |
| 7,642,855 B2 * | 1/2010 | Van Zanten | 330/292 |

OTHER PUBLICATIONS

B.K. Thandri et al., A Robust Feedforward Compensation Scheme for Multistage Operational Transconductance Amplifiers With No Miller Capacitors, IEEE Journal of Solid-State Circuits, Feb. 2003, pp. 237-243, vol. 38, No. 2.

* cited by examiner

*Primary Examiner* — Steven J Mottola
(74) *Attorney, Agent, or Firm* — E. Russell Tarleton; Seed IP Law Group PLLC

(57) ABSTRACT

An operational amplifier having a first amplification stage with an input terminal to receive a signal to be amplified, and a first output terminal, and a second amplification stage having a first input terminal connected to the first output terminal, and an output terminal to provide the amplified signal. The first and second amplification stages define, between the input terminal and the output terminal, a signal transfer function having first and second poles. The amplifier further includes a decoupling stage having a further input terminal connected to the first stage input terminal, and a further output terminal connected to the second stage output terminal. The decoupling stage is so arranged as to introduce at least one zero in the operational amplifier transfer function.

21 Claims, 2 Drawing Sheets

OPERATIONAL TRANSCONDUCTANCE AMPLIFIER HAVING TWO AMPLIFICATION STAGES

BACKGROUND

1. Technical Field

The present disclosure pertains to an amplification electronic device and, more particularly, to an operational amplifier of the transconductance type that includes two amplification stages.

2. Description of the Related Art

In order to achieve a reduction of power consumption in telecommunications equipment and systems, for example, for wireless applications, there is a tendency to reduce the supply voltage of the electronic circuits that are employed in such systems. Due to the development of improved technological processes, it is now possible for digital and analog circuit systems to operate at a supply voltage of about 1.2 V.

Particularly, for applications relating to time-sampled analog networks operating at frequencies of tens to hundreds MHz, such supply voltage of the circuits imposes to implement and employ specific operational amplifiers that are capable of ensuring suitable performances for the above-mentioned applications, particularly with reference to the frequency response of such amplifiers and to the dynamics of the output signal. At the same time, such amplifiers have to ensure a low current consumption.

An operational transconductance amplifier (OTA) of known type currently employed in circuits of time-sampled analog networks, for example, at the supply voltage of 1.2 V, is the Miller amplifier. Such amplifier includes two amplification stages; therefore, it ensures a suitable voltage gain for most applications.

However, the Miller amplifier is not free from drawbacks. In fact, as it is known, the frequency response of such operational amplifier is determined by the presence of two poles corresponding to high impedance nodes of the same amplifier. Particularly, each pole is associated with a high impedance node relative to each of the amplification stages. In order to ensure the stability of such Miller amplifier, it is known to provide for a compensation capacity between the above-mentioned high impedance nodes. The introduction of such capacity allows obtaining the pole splitting effect, which is known to those skilled in the art, wherein it causes the reduction of the characteristic frequency of one of the poles, or fundamental pole, of the operational, and the increase of the second pole characteristic frequency.

In more detail, as it is known to those skilled in the art, following to compensation, the frequency response of the open loop operational amplifier is characterized by a transition frequency $F_T$, equal to:

$$F_T = \frac{gm_1}{2\pi C_{C1}}$$

where $C_{C1}$ is the compensation capacitance of the amplifier, and $gm_1$ is the transconductance of the transistors of the first amplification stage. The frequency of the second pole $F_2$ is about:

$$F_2 \cong \frac{gm_2}{2\pi C_L} \frac{3}{4}$$

where $C_L$ is the loading capacitance of the amplifier, and $gm_2$ is the transconductance of the transistors of the second amplification stage.

As it is known, in order to ensure the stability of the Miller amplifier, the condition has to be true that:

$$F_T \leq 3F_2 \Rightarrow \frac{gm_2}{gm_1} \geq 4\frac{C_L}{C_{C1}} \tag{1a}$$

Therefore, the transition frequency $F_T$ is limited by the second pole frequency $F_2$.

Since the whole amplifier bandwidth is determined by the open-loop transition frequency of the response, in order to obtain a suitable band, particularly for wireless applications, it is necessary to increase the $gm_1$ and $gm_2$ values and, consequently, also to increase the current consumption.

BRIEF SUMMARY

The present disclosure is directed to devising and providing an operational amplifier, particularly of the transconductance type, which allows at least partially overcoming to the drawbacks set forth above with reference to the operational amplifiers of the known type.

In accordance with one embodiment of the present disclosure, an operational amplifier is provided that includes a first amplification stage having an input terminal to receive a signal to be amplified, and a first output terminal; a second amplification stage having a first input terminal connected to said first output terminal and an output terminal to provide the amplified signal; the first and second amplification stages defining, between the input terminal and the output terminal, a signal transfer function having a first pole and a second pole; and a decoupling stage having a further input terminal connected to the first stage input terminal, and a further output terminal connected to the second stage output terminal, the decoupling stage arranged as to introduce at least one zero in the operational amplifier transfer function.

In accordance with another embodiment of the present disclosure, a device is provided that includes a first amplification stage having an input terminal to receive a signal to be amplified, and a first output terminal; a second amplification stage having a first input terminal connected to the first output terminal, and an output terminal to provide the amplified signal, the first and second amplification stages defining, between the input terminal and the output terminal, a signal transfer function having a first pole and a second pole; and a decoupling stage having a further input terminal connected to the first stage input terminal, and a further output terminal connected to the second stage output terminal, the decoupling stage arranged so as to introduce at least one zero in the operational amplifier transfer function.

In accordance with yet a further embodiment of the present disclosure, a circuit is provided that includes a transconductance amplifier adapted to drive a capacitive load, the transconductance amplifier including first and second stages, the first stage having input terminals to receive a signal to be amplified, the second stage having output terminals coupled to the capacitive load, the transconductance amplifier providing a signal transfer function for the signal to be amplified that is given by:

$$\frac{V_{OUT}}{V_{IN}} = \frac{-gm_1 gm_2 + gm_1 sC_C - gm_3 s(C_C + C_1)}{s(C_C + C_1)\left[s\dfrac{C_C^2}{C_C + C_1} - sC_C - \right.} = H(s)$$
$$\left. sC_L - gm_2 \dfrac{C_C}{C_C + C_1}\right]$$

whereby a pulsation of the zero is given by the equation:

$$\omega_z = \frac{gm_1 gm_2}{gm_1 C_C - gm_3(C_C + C_1)} = \frac{gm_2}{C_C - \frac{gm_3}{gm_1}(C_C + C_1)}$$

and a pulsation of the amplifier second pole is given by the equation:

$$\omega_{p2} = -\frac{gm_2}{C_1 + C_L + \frac{C_1 C_L}{C_C}}$$

In accordance with another aspect of the foregoing embodiment, the circuit includes a decoupling stage having an input terminal and connected to one of the input terminals of the first stage and an output terminal coupled to an output terminal of the second stage and structured to introduce at least one zero in the transfer function.

In accordance with yet a further aspect of the foregoing embodiment, the transconductance amplifier is further connected to a biasing stage that includes first and second PMOS transistors in a diode configuration, mutually connected in series and to a bias current generator, the biasing stage configured to maintain the reference potential on the gate terminal of a further electronic transistor in order to establish an output current of the amplifier, the further electronic transistor formed as part of an electronic follower device of the decoupling stage that is connected between a ground terminal and a bias terminal and provided with a further input terminal connected to one of the input terminals of the first stage, the electronic follower device having a PMOS transistor configured as a source follower that is connected to the bias terminal through a bias transistor driven by a gate reference potential, the electronic follower device having a respective output connected to a gate terminal of the further transistor having source and drain terminals connected between the bias terminal and the output terminal of the amplifier.

BRIEF DESCRIPTION OF THE SEVERAL VIEWS OF THE DRAWINGS

The characteristics and advantages of the above-mentioned operational amplifier will result from the description reported below of a preferred exemplary embodiment, given by way of non-limiting example, with reference to the annexed Figures, in which.

DETAILED DESCRIPTION

Figure 1:
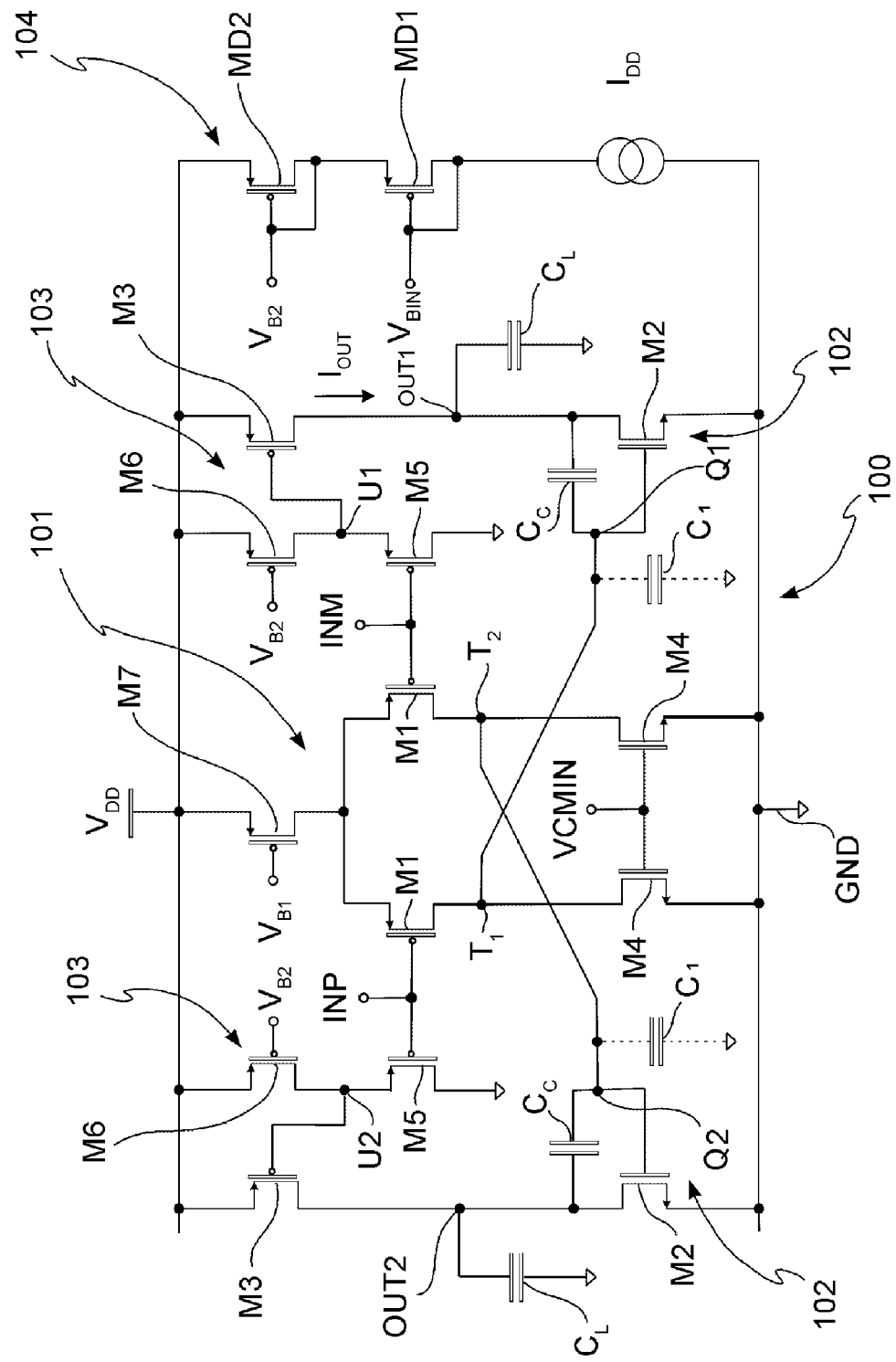
FIG. 1 shows a circuit schematic of an exemplary embodiment of the above-mentioned operational amplifier.

With reference to the above-mentioned FIG. 1, an exemplary embodiment of an innovative operational amplifier has been generally indicated with 100. Particularly, such operational amplifier 100 is implemented in CMOS technology, and it is preferably a transconductance amplifier adapted to drive a capacitive load $C_L$.

It shall be noted that such operational amplifier 100 can be preferably used in time-sampled analog networks at operative frequencies on the order of tens/hundreds MHz.

Furthermore, the amplifier 100 includes a supply terminal connectable to a supply potential $V_{DD}$ which is provided, for example, by a battery, and a ground terminal connectable to a ground potential GND. Preferably, the supply potential $V_{DD}$ is about 1.2 V.

The operational amplifier 100 also includes, in input, a first amplification stage 101 having input terminals INM, INP to receive a signal to be amplified. Preferably, such first amplification stage 101 is a differential stage provided with respective differential input terminals INM, INP. Particularly, such differential stage includes PMOS transistors M1, each of the gate terminals of which are connected to one of the above-mentioned differential inputs INM, INP.

In addition, source terminals of the transistors M1 are connected to the supply potential $V_{DD}$ through a PMOS transistor M7. Such transistor M7 is driven by a first reference potential $V_{B1}$ to generate a bias current for the differential stage 101.

Furthermore, drain terminals of the transistors M1 are connected to respective devices M4 operating as active loads. For example, such active loads are implemented in NMOS transistors M4 driven by a reference potential VCMIN.

In addition, the first amplification stage 101 includes first differential output terminals T1 and T2 at the drain terminals of the transistors M1. In this regard, it shall be noted that the operational amplifier 100 has a completely differential circuit structure, therefore it has differential output terminals OUT1 and OUT2 to provide the amplified signal on the capacitive loads $C_L$. Particularly, with reference to FIG. 1, such circuit structure is obtained by duplicating the circuit components connected to the above-mentioned first differential output terminals T1 and T2 of the first differential input stage 101.

In more detail, the operational amplifier 100 comprises a second amplification stage 102 which is implemented in NMOS transistors M2 in common source. Each second stage transistor M2 has the drain and source terminals connected to one of the amplifier 100 output terminals OUT1, OUT2, and to the ground terminal GND, respectively. First input terminals Q1, Q2 or gate terminals of the transistors M2 are connected to one of the first output terminals T1, T2 of the first differential stage 101.

The operational amplifier 100 further comprises decoupling devices 103, each of which is so configured as to be interposed between the differential input terminal INM, INP of the first amplification stage 101 and one of the amplifier 100 differential output terminals OUT1, OUT2.

In more detail, each decoupling device 103 comprises an electronic follower device M5 of the signal applied at the input of the first amplification stage 101. Such follower device is implemented in a PMOS transistor M5 configured as a source follower connected to a PMOS bias transistor M6. Particularly, a gate terminal of the follower M5, which represents an input terminal for the whole decoupling device 103, is connected to one of the differential input terminals, for example, INM, of the first stage 101. Drain and source terminals of the transistor M5 are connected to the ground potential GND and to the transistor M6, respectively. Such transistor M6 is so configured as to generate a bias current for the follower M5. Such transistor M6 is connected to the supply potential $V_{DD}$, and it is driven by a second reference potential $V_{B2}$.

Furthermore, each decoupling device 103 comprises a further PMOS transistor M3 connected between the supply terminal $V_{DD}$ and each output terminal OUT1, OUT2 of the operational amplifier 100. Such transistors M3 have respective gate terminals connected to further outputs U1, U2 of the follower device M5. Particularly, such further outputs coincide with the source terminals of the transistors M5.

It shall be noted that such further transistors M3 represent A-class load transistors for the second amplification stage 102 transistors M2.

With reference to FIG. 1, it shall be noted that, through the bias terminal $V_{DD}$ and the ground terminal GND, the operational amplifier 100 is connected, by way of example, to a biasing stage 104. Such biasing stage 104 comprises a first MD1 and a second MD2 PMOS transistors in a diode configuration, mutually connected in series, and to a bias current generator $I_{DD}$. Particularly, the first transistor MD1 is adapted to provide a reference potential $V_{BIN}$ for an optional common mode potential control network relative to the differential input terminals INM, INP of the first amplification stage 101. Similarly, the second transistor MD2 is adapted to provide the above-indicated second bias potential $V_{B2}$ to the transistor M6 gate terminal of the decoupling stage 103.

It shall be noted that the biasing stage 104 is so configured as to ensure a potential equal to the second bias potential $V_{B2}$ to the PMOS transistor M3 gate terminal. In this manner, advantageously, the second potential $V_{B2}$ allows establishing the output current $I_{OUT}$ provided to the capacitive load $C_L$.

Furthermore, the operational amplifier 100 of FIG. 1 comprises compensation capacitances Cc connected between the gate and drain terminals of the second stage 102 transistors M2. As it is known to those skilled in the art, such capacitors are adapted to stabilize the operational amplifier in terms of frequency response. In fact, through such capacitances, the operative frequency associated with one of the poles, or the main pole, of the operational amplifier is split (pole splitting) towards lower values than that associated with such pole in the absence of compensation. Instead, the frequency of the other pole, or secondary pole, is brought to frequency values above that associated to such second pole in the absence of compensation.

Herein below it shall be assumed that the follower devices M5 of the amplifier 100 are substantially ideal, that is, a voltage $V_{IN}$ applied to the differential input terminals INM and INP is to be entirely applied to the further outputs U1, U2 of the decoupling stage 103 (therefore to the gate terminals of the transistors M3). Furthermore, an amplified voltage present on the amplifier 100 differential output terminals OUT1, OUT2 will be indicated with $V_{OUT}$.

Figure 2:
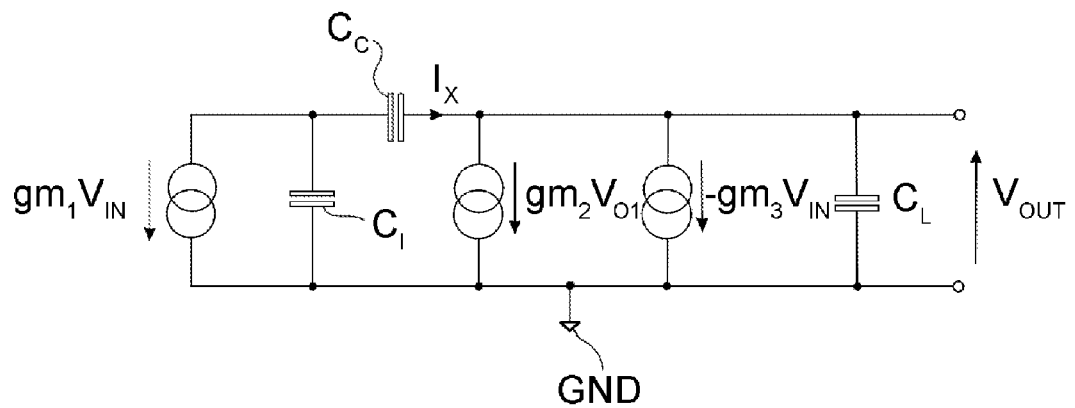
FIG. 2 schematically shows a high-frequency equivalent circuit of the amplifier of FIG. 1.

With reference to a high-frequency circuit of FIG. 2, equivalent to the amplifier 100 circuit scheme, it is possible to perform a small-signal analysis (the detailed calculations of which are reported in the annexed Appendix) of the above-mentioned amplifier 100 in the domain of the Laplace transform to obtain the relationship correlating the output differential voltage $V_{OUT}$ and the input differential voltage $V_{IN}$, that is, a transfer function H(s) of the same amplifier 100. Particularly, such transfer function H(s) is equal to:

$$\frac{V_{OUT}}{V_{IN}} = \frac{\frac{gm_1 gm_2}{s(C_C + C_1)} + gm_1 \frac{C_C}{C_C + C_1} - gm_3}{s\frac{C_C^2}{C_C + C_1} - sC_C - sC_L - gm_2 \frac{C_C}{C_C + C_1}} \quad (1)$$

$$\frac{V_{OUT}}{V_{IN}} = \frac{-gm_1 gm_2 + gm_1 s C_C - gm_3 s(C_C + C_1)}{s(C_C + C_1)\left[s\frac{C_C^2}{C_C + C_1} - sC_C - sC_L - gm_2 \frac{C_C}{C_C + C_1}\right]} = H(s)$$

where:
$gm_1$, $gm_2$ and $gm_3$ are the transconductance values of the transistors M1, M2, and M3, respectively, $C_1$ is the equivalent capacity present on the input of the second amplification stage 102.

In the above-indicated analysis, by the term high frequency are meant frequency values, such that the output resistances of the transistors can be neglected. This assumption is to be considered as valid for frequency values proximate to a transition frequency $F_T$ of the operational amplifier 100. Such transition frequency is given by:

$$F_T = \frac{gm_1}{2\pi C_C} \quad (2)$$

where $C_C$ is the compensation capacitance of the amplifier 100, and $gm_1$ is the transconductance of the transistors M1 of the first amplification stage 101.

As it is known, said poles of the transfer function H(S) are the values of the complex variable s which cancels the transfer function (1) denominator, while zeros are defined to be those values of s that make the numerator equal to zero.

With reference to the circuit scheme of the proposed operational amplifier 100, it shall be noted that the decoupling stage 103 is so arranged as to introduce at least one zero in the amplifier 100 transfer function H(S).

In the particular case of the transfer function (1), the pulsation of the single zero $\omega_z$ can be obtained by the equation:

$$-gm_1 gm_2 + gm_1 s C_C - gm_3 s(C_C + C_1) = 0 \quad (3)$$

that is, $$\omega_z = \frac{gm_1 gm_2}{gm_1 C_C - gm_3(C_C + C_1)} = \frac{gm_2}{C_C - \frac{gm_3}{gm_1}(C_C + C_1)}$$

Similarly, the pulsation of the secondary pole $\omega_{p2}$ of the amplifier 100, can be obtained by the equation:

$$s\frac{C_C^2}{C_C + C_1} - sC_C - sC_L = gm_2 \frac{C_C}{C_C + C_1} \quad (4)$$

therefore:

$$\omega_{p2} = -\frac{gm_2}{C_1 + C_L + \frac{C_1 C_L}{C_C}}$$

Figure 3:
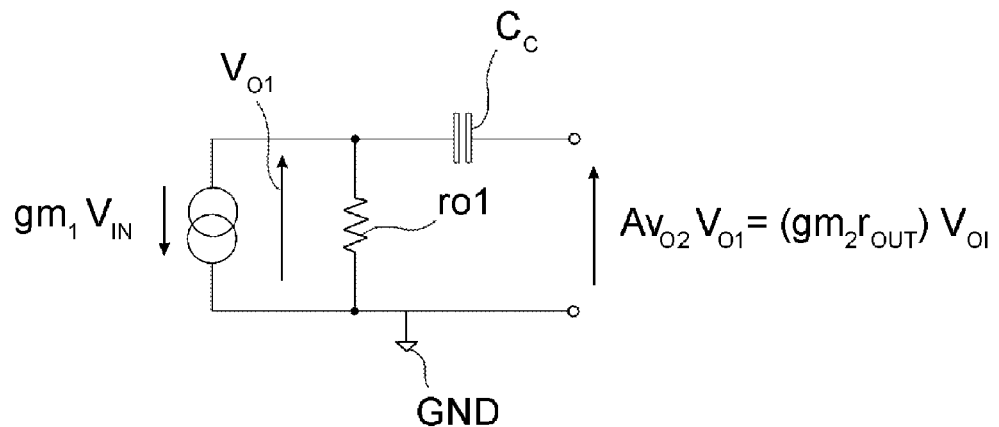
FIG. 3 schematically shows a low-frequency equivalent circuit of the amplifier of FIG. 1.

A pulsation of the amplifier 100 main pole, or first pole, $\omega_{p1}$ can be obtained by performing an analysis of the low-frequency equivalent circuit of the amplifier 100 shown in FIG. 3. By low frequency, it is meant that the above-mentioned analysis is valid for those frequency values for which the Miller effect on the capacitance $C_C$ is relevant compared to the other circuit elements. For example, this is valid for frequency values below $F_T/10$.

Particularly, such main pole $\omega_{p1}$ is expressed by the relationship:

$$\omega_{p1} = \frac{1}{r_{O1} C_C (1 + A_{Vo2})} \quad (5)$$

$$= \frac{1}{r_{O1} C_C (1 + gm_2 r_{OUT})}$$

$$\cong \frac{1}{r_{O1} gm_2 r_{OUT} C_C}$$

in which:

$r_{O1}$ is the output resistance of the first amplification differential stage 101 present at one of the first output terminals T1 or T2;

$A_{Vo2}$ is the low-frequency voltage gain of the second amplification stage 102;

$r_{OUT}$ is the amplifier 100 output resistance present at one of the output terminals OUT1 or OUT2.

The above-mentioned pulsation of the main pole $\omega_{p1}$ is related to the amplifier transition frequency $F_T$ by the relationship:

$$2\pi F_T = A_{VO}\omega_{p1} = \frac{gm_1}{C_C} \quad (6)$$

where $$A_{VO} = gm_1 r_{O1} gm_2 r_{OUT}$$

is the low-frequency voltage gain of the whole amplifier 100.

In relationship to the transfer function H(s) of the amplifier 100, the Applicant has disclosed that it is advantageously possible to make the above-mentioned zero $\omega_z$ pulsation equal to that of the secondary pole $\omega_{p2}$ by operating on the amplifier 100 circuit parameters, with the aim of eliminating the effect of such secondary pole.

Particularly, in order for this to occur, that is, the pulsations of the zero and of the secondary pole coincide, starting from the previous relationships (3) and (4), the condition has to be true that:

$$\omega_Z = \omega_{p2} \rightarrow C_1 + C_L + \frac{C_1 C_L}{C_C} = -C_C + \frac{gm_3}{gm_1}(C_C + C_1) \quad (7)$$

that is:

$$\frac{gm_3}{gm_1} = \frac{C_1 + C_L + C_C + \frac{C_1 C_L}{C_C}}{C_C + C_1} = 1 + \frac{\frac{C_L C_C + C_L C_1}{C_C}}{C_C + C_1} \quad (8)$$

therefore $$\frac{gm_3}{gm_1} = \frac{C_C + C_L}{C_C}$$

In other terms, once the value of the load capacitances $C_L$ which are driven by the amplifier 100 has been established, once the ratio between the bias currents of the transistors M1 (from which $gm_1$ depends) of the first amplification stage 101 and those of the transistors M3 (from which $gm_3$ depends) has been fixed, it is possible to derive the value of the compensation capacitance $C_C$ which satisfies the equation (8), thus ensuring the cancellation of the effect of the secondary pole $\omega_{p2}$ through the zero $\omega_z$.

By comparing the above-mentioned relationship (8), which is valid for the amplifier 100, to the relationship (1a), which is valid for the Miller amplifier, it shall be noted that, while keeping the ratio of transconductance values constant, that is, while keeping the bias currents of the amplifiers constant (since the gm values depend on such currents), and while keeping the driven capacitive loads $C_L$ constant, the compensation capacitance $C_C$ which has to be employed in the amplifier 100 of the proposed solution is advantageously about thrice less than that required to compensate the Miller amplifier of known type.

For example, by selecting a gm ratio equal to 4, the relationship (8) implies that the amplifier 100 compensation capacitance $C_C$ is equal to one third of the load capacitance $C_L$. Instead, with reference to the relationship (1a) relative to the Miller amplifier, by selecting a gm ratio equal to 4, the compensation capacitance $C_c$ is always higher than or at most equal to the load capacitance $C_L$.

Furthermore, since the operational amplifier 100 band is determined by the transition frequency $F_T$ of the relationship (2), therefore by the pulsation of the main pole $\omega_{p1}$ based on (6), following the above-indicated reduction of the compensation capacitance $C_C$, the proposed amplifier 100 advantageously ensures also a higher band than that provided by the Miller amplifier, while keeping the bias currents and load capacities to be driven constant. In this manner, the amplifier 100 can be advantageously employed in all the more recent wireless applications.

Furthermore, compared to the Miller amplifier, the proposed transconductance amplifier 100 advantageously ensures a reduction of the current dissipation, while keeping the obtained pass band constant.

To the above-described embodiments of the operational amplifier, those of ordinary skill in the art, to the aim of meeting contingent needs, will be able to make modifications, adaptations, and replacements of elements with functionally equivalent other elements, without departing from the scope of the following claims. Each of the characteristics described as belonging to a possible embodiment can be implemented independently from the other embodiments described.

Appendix

With reference to the high-frequency circuit of FIG. 2, which is equivalent to the amplifier 100 circuit scheme, the ratio between the output differential voltage $V_{OUT}$ and the input differential voltage $V_{IN}$, that is, the transfer function H(s) of such circuit, is obtained from:

$$i_X = (V_{O1} - V_{OUT})sC_C$$

$$i_X = gm_2 V_{O1} - gm_3 V_{in} + V_{OUT}sC_L$$

$$V_{O1} = (-gm_1 V_{IN} - i_X)/sC_1$$

$$V_{O1}sC_C - V_{OUT}sC_C = gm_2 V_{O1} - gm_3 V_{IN} + V_{OUT}sC_L$$

$$V_{O1} = -\frac{gm_1}{sC_1}V_{IN} - \frac{C_C}{C_1}V_{O1} + \frac{C_C}{C_1}V_{OUT}$$

$$V_{O1} = -V_{IN}\frac{gm_1}{s(C_1 + C_C)} + V_{OUT}\frac{C_C}{C_C + C_1} -$$

$$V_{IN}gm_1\frac{C_C}{C_C + C_1} + V_{OUT}\frac{sC_C^2}{C_C + C_1} - V_{OUT}sC_C = -$$

$$V_{IN}\frac{gm_1 gm_2}{s(C_C + C_1)} + V_{OUT}gm_2\frac{C_C}{C_C + C_1} -$$

$$gm_3 V_{IN} + V_{OUT}sC_L$$

$$V_{OUT}\left[\frac{sC_C^2}{C_C + C_1} - sC_C - \\ sC_L - gm_2\frac{C_C}{C_C + C_1}\right] = V_{IN}\left[-\frac{gm_1 gm2}{s(C_C + C_1)} + \\ gm_1\frac{C_C}{C_C + C_1} - gm_3\right]$$

therefore

-continued $$\frac{V_{OUT}}{V_{IN}} = \frac{\frac{gm_1 gm_2}{s(C_C + C_1)} + gm_1 \frac{C_C}{C_C + C_1} - gm_3}{s \frac{C_C^2}{C_C + C_1} - sC_C - sC_L - gm_2 \frac{C_C}{C_C + C_1}}$$

$$\frac{V_{OUT}}{V_{IN}} = \frac{-gm_1 gm_2 + gm_1 sC_C - gm_3 s(C_C + C_1)}{s(C_C + C_1)\left[\begin{array}{c} s\frac{C_C^2}{C_C + C_1} - sC_C - \\ sC_L - gm_2 \frac{C_C}{C_C + C_1} \end{array}\right]} = H(s)$$

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An operational amplifier, comprising:
a first amplification stage having an input terminal structured to receive a signal to be amplified, and a first output terminal;
a second amplification stage having a first input terminal connected to the first output terminal, and an output terminal structured to provide the amplified signal, the first and second amplification stages defining, between the input terminal and the output terminal, a signal transfer function having a first pole and a second pole; and
a decoupling stage having a further input terminal connected to the first stage input terminal, and a further output terminal connected to the second stage output terminal, the decoupling stage structured to introduce at least one zero in the operational amplifier transfer function, the decoupling stage having an electronic follower device connected between a ground terminal and a bias terminal and provided with a further input terminal connected to the input terminal of the first stage, the follower device structured as a source follower that is connected to the bias terminal through a bias transistor.

2. The operational amplifier according to claim 1, wherein the electronic follower device is a PMOS transistor and the bias transistor is structured to be driven by a gate reference potential.

3. The operational amplifier according to claim 2, wherein the electronic follower device includes a respective output connected to a gate terminal of a further transistor, the further transistor having source and drain terminals connected between the bias terminal and the output terminal of the amplifier.

4. The operational amplifier according to claim 3, wherein the further transistor is structured as an A-class load transistor for a second amplification stage transistor.

5. The operational amplifier according to claim 1, wherein the input terminal of the first amplification stage includes two differential input terminals, the first output terminal includes two differential output terminals, and the output terminal of the second amplification stage includes two differential output terminals.

6. The operational amplifier according to claim 3, wherein the amplifier is further connected to a biasing stage that has first and a second PMOS transistors in a diode configuration, mutually connected in series and to a bias current generator, the biasing stage configured to maintain the reference potential on the gate terminal of the further electronic transistor in order to establish an output current of the amplifier.

7. The operational amplifier according to claim 1, wherein said signal transfer function is given by:

$$\frac{V_{OUT}}{V_{IN}} = \frac{-gm_1 gm_2 + gm_1 sC_C - gm_3 s(C_C + C_1)}{s(C_C + C_1)\left[\begin{array}{c} s\frac{C_C^2}{C_C + C_1} - sC_C - \\ sC_L - gm_2 \frac{C_C}{C_C + C_1} \end{array}\right]} = H(s)$$

whereby a pulsation of said zero is given by the equation:

$$\omega_z = \frac{gm_1 gm_2}{gm_1 C_C - gm_3(C_C + C_1)} = \frac{gm_2}{C_C - \frac{gm_3}{gm_1}(C_C + C_1)}$$

and a pulsation of the amplifier second pole is given by the equation:

$$\omega_{p2} = -\frac{gm_2}{C_1 + C_L + \frac{C_1 C_L}{C_C}}$$

wherein $gm_1$, $gm_2$, and $gm_3$ are transconductance values in the first and second stages, $C_L$ is a load capacitance, $C_c$ is a compensation capacitance of the amplifier, and $C_1$ is an equivalent capacitance on the second stage input terminal.

8. The operational amplifier according to claim 7, wherein the pulsation of the above-mentioned zero is made equal to that of the second pole in order to eliminate the effect of such second pole.

9. The operational amplifier according to claim 1, wherein said amplifier has a transconductance adapted to drive capacitive loads and for implementation of time-sampled analog networks for wireless communications.

10. A device, comprising:
an operational amplifier, the operational amplifier including:
a first amplification stage having an input terminal structured to receive a signal to be amplified, and a first output terminal;
a second amplification stage having a first input terminal connected to the first output terminal, and an output terminal structured to provide the amplified signal, the first and second amplification stages structured to provide, between the input terminal and the output terminal, a signal transfer function having a first pole and a second pole;
a decoupling stage having a further input terminal connected to the first stage input terminal, and a further output terminal connected to the second stage output terminal, the decoupling stage structured to introduce at least one zero in the operational amplifier transfer function, the decoupling stage having an electronic follower device coupled between a ground terminal and a bias terminal and provided with a further input terminal connected to the input terminal of the first stage, the electronic follower device structured as a source follower that is connected to the bias terminal through a bias transistor driven by a gate reference potential.

11. The device of claim 10, wherein said signal transfer function is given by:

$$\frac{V_{OUT}}{V_{IN}} = \frac{-gm_1 gm_2 + gm_1 sC_C - gm_3 s(C_C + C_1)}{s(C_C + C_1)\left[s\frac{C_C^2}{C_C + C_1} - sC_C - \atop sC_L - gm_2 \frac{C_C}{C_C + C_1}\right]} = H(s)$$

whereby a pulsation of said zero is given by the equation:

$$\omega_z = \frac{gm_1 gm_2}{gm_1 C_C - gm_3(C_C + C_1)} = \frac{gm_2}{C_C - \frac{gm_3}{gm_1}(C_C + C_1)}$$

and a pulsation of the amplifier second pole is given by the equation:

$$\omega_{p2} = -\frac{gm_2}{C_1 + C_L + \frac{C_1 C_L}{C_C}}$$

wherein $gm_1$, $gm_2$, and $gm_3$ are transconductance values in the first and second stages, $C_L$ is a load capacitance, $C_c$ is a compensation capacitance of the amplifier, and $C_1$ is an equivalent capacitance on the second stage input terminal.

12. The device of claim 10, wherein the electronic follower device is a PMOS transistor, and the electronic follower device further includes a respective output connected to a gate terminal of a further transistor that has source and drain terminals connected between the bias terminal and the output terminal of the amplifier.

13. The device of claim 10, wherein the further transistor comprises an A-class load transistor for a second amplification stage transistor.

14. The device of claim 10, wherein the amplifier is further connected to a biasing stage comprising first and second PMOS transistors in a diode configuration, mutually connected in series and to a bias current generator, the biasing stage configured to maintain the reference potential on the gate terminal of the further electronic transistor in order to establish an output current of the amplifier.

15. A circuit, comprising:
a transconductance amplifier adapted to drive a capacitive load, the transconductance amplifier comprising first and second stages, the first stage having input terminals to receive a signal to be amplified, the second stage having output terminals coupled to the capacitive load, the transconductance amplifier providing a signal transfer function for the signal to be amplified that is given by:

$$\frac{V_{OUT}}{V_{IN}} = \frac{-gm_1 gm_2 + gm_1 sC_C - gm_3 s(C_C + C_1)}{s(C_C + C_1)\left[s\frac{C_C^2}{C_C + C_1} - sC_C - \atop sC_L - gm_2 \frac{C_C}{C_C + C_1}\right]} = H(s)$$

whereby a pulsation of the zero is given by the equation:

$$\omega_z = \frac{gm_1 gm_2}{gm_1 C_C - gm_3(C_C + C_1)} = \frac{gm_2}{C_C - \frac{gm_3}{gm_1}(C_C + C_1)}$$

and a pulsation of the amplifier second pole is given by the equation:

$$\omega_{p2} = -\frac{gm_2}{C_1 + C_L + \frac{C_1 C_L}{C_C}}$$

wherein $gm_1$, $gm_2$, and $gm_3$ are transconductance values in the first and second stages, $C_L$ is a load capacitance, $C_c$ is a compensation capacitance of the amplifier, and $C_1$ is an equivalent capacitance on the second stage input terminal.

16. The circuit of claim 15, comprising a decoupling stage having an input terminal and connected to one of the input terminals of the first stage and an output terminal coupled to an output terminal of the second stage and structured to introduce at least one zero in the transfer function.

17. The circuit of claim 16, wherein the transconductance amplifier is further connected to a biasing stage that comprises first and second PMOS transistors in a diode configuration, mutually connected in series and to a bias current generator, the biasing stage configured to maintain the reference potential on the gate terminal of a further electronic transistor in order to establish an output current of the amplifier, the further electronic transistor formed as part of an electronic follower device of the decoupling stage that is connected between a ground terminal and a bias terminal and provided with a further input terminal connected to one of the input terminals of the first stage, the electronic follower device comprising a PMOS transistor configured as a source follower that is connected to the bias terminal through a bias transistor driven by a gate reference potential, the electronic follower device having a respective output connected to a gate terminal of the further transistor having source and drain terminals connected between the bias terminal and the output terminal of the amplifier.

18. A device, comprising:
an operational amplifier, the operational amplifier including:
a first amplification stage having an input terminal structured to receive a signal to be amplified, and a first output terminal;
a second amplification stage having a first input terminal connected to the first output terminal, and an output terminal structured to provide the amplified signal, the first and second amplification stages structured to provide, between the input terminal and the output terminal, a signal transfer function having a first pole and a second pole;
a decoupling stage having a further input terminal connected to the first stage input terminal, and a further output terminal connected to the second stage output terminal, the decoupling stage structured to introduce at least one zero in the operational amplifier transfer function, the signal transfer function given by:

$$\frac{V_{OUT}}{V_{IN}} = \frac{-gm_1 gm_2 + gm_1 sC_C - gm_3 s(C_C + C_1)}{s(C_C + C_1)\left[s\frac{C_C^2}{C_C + C_1} - sC_C - sC_L - gm_2 \frac{C_C}{C_C + C_1}\right]} = H(s)$$

whereby a pulsation of said zero is given by the equation:

$$\omega_Z = \frac{gm_1 gm_2}{gm_1 C_C - gm_3 (C_C + C_1)} = \frac{gm_2}{C_C - \frac{gm_3}{gm_1}(C_C + C_1)}$$

and a pulsation of the amplifier second pole is given by the equation:

$$\omega_{p2} = -\frac{gm_2}{C_1 + C_L + \frac{C_1 C_L}{C_C}}$$

wherein $gm_1$, $gm_2$, and $gm_3$ are transconductance values in the first and second stages, $C_L$ is a load capacitance, $C_c$ is a compensation capacitance of the amplifier, and $C_1$ is an equivalent capacitance on the second stage input terminal.

19. The device of claim 18, wherein the decoupling stage comprises an electronic follower device coupled between a ground terminal and a bias terminal and provided with a further input terminal connected to the input terminal of the first stage, the electronic follower device including a PMOS transistor configured as a source follower that is connected to the bias terminal through a bias transistor driven by a gate reference potential, the electronic follower device further including a respective output connected to a gate terminal of a further transistor that has source and drain terminals connected between the bias terminal and the output terminal of the amplifier.

20. The device of claim 19, wherein the further transistor comprises an A-class load transistor for a second amplification stage transistor.

21. The device of claim 19, wherein the amplifier is further connected to a biasing stage comprising first and second PMOS transistors in a diode configuration, mutually connected in series and to a bias current generator, the biasing stage configured to maintain the reference potential on the gate terminal of the further electronic transistor in order to establish an output current of the amplifier.

* * * * *